(12) United States Patent
Higashimoto et al.

(10) Patent No.: US 6,356,018 B1
(45) Date of Patent: *Mar. 12, 2002

(54) SHORT ARC TUBE HAVING AN INTERMEDIATE LAYER BETWEEN THE SIDE TUBE AND THE RETAINING BODY

(75) Inventors: Youichiro Higashimoto; Yukihiro Morimoto; Yoshihiko Shinohara, all of Himeji (JP)

(73) Assignee: Ushiodenki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,604

(22) Filed: Oct. 28, 1998

(30) Foreign Application Priority Data

Oct. 31, 1997 (JP) ................................. 9-314649

(51) Int. Cl.⁷ ............................. H01J 61/36; H01J 1/88; H01J 1/96
(52) U.S. Cl. ...................... 313/623; 313/626; 313/253
(58) Field of Search ................................. 313/623, 626, 313/634, 636, 637, 253, 331, 332, 242, 252

(56) References Cited

U.S. PATENT DOCUMENTS 4,038,578 A * 7/1977 Mathijssen .................. 313/217
4,481,443 A 11/1984 Mathijssen

OTHER PUBLICATIONS

Database WPI, Week 9638, Derwent Publications Ltd., London, GB; AN 96–376645, XP002101689–& JP 08 180839A (USHIO INC), Jul. 12, 1996, Abstract, Figures.

Patent Abstracts of Japan, vol. 16, No. 336, (E–1237), Jul. 21, 1992 & JP 04 101348 A (USHIO INC), Apr. 2, 1992, Abstract.

Patent Abstracts of Japan, vol. 013, No. 410 (E–819), Sep. 11, 1989 & JP 01 151149 A (TOSHIBA CORP), Jun. 13, 1989, Abstract.

Database WPI, Section EI, Week 9814, Derwent Publications Ltd., London, GB; Class U11, AN 98–150977, XP002101690 & JP 10 021882 A (TOSHIBA LIGHTECH KK), Jan. 23, 1998, Abstract.

Patent Abstracts of Japan, vol. 098, No. 011, Sep. 1998 & JP 10 149801 A (IWASAKI ELECTRIC CO LTD), Jun. 2, 1998, Abstract.

* cited by examiner

*Primary Examiner*—Nimeshkumar D. Patel
*Assistant Examiner*—Karabi Guharay
(74) *Attorney, Agent, or Firm*—Nixon Peabody LLP; David S. Safran

(57) ABSTRACT

A short arc lamp with a high lamp sustaining voltage in which there is no crack formation in the corner areas of the faces of shrunken regions of a side tube and of cylindrical retaining bodies for upholding parts of the electrodes, even if the gas pressure is high during operation is obtained, in a short arc lamp in which arc tube has a cathode and an anode disposed opposite one another, and in which the upholding parts of the cathode and anode are inserted and held in cylindrical retaining bodies which are supported in the shrunken regions of side tubes connected to the arc tube, by intermediate layers of metal or ceramic being located between the cylindrical retaining bodies and the shrunken regions, and by the cylindrical retaining bodies and the shrunken regions not being welded to one another into a single part.

7 Claims, 5 Drawing Sheets

SHORT ARC TUBE HAVING AN INTERMEDIATE LAYER BETWEEN THE SIDE TUBE AND THE RETAINING BODY

BACKGROUND OF THE INVENTION

1. Field of the Invention

The invention relates to a short arc lamp which is used for a light source for a projector, semiconductor exposure and ultraviolet curing or for similar purposes.

2. Description of the Related Art

For a light source for a projector, for example, a short arc lamp which is filled with xenon gas is conventionally often used. Recently, however, there has been a great demand for even greater brightness of the projection images of the projector. Therefore, there is the tendency for the amount of added xenon gas to become greater and greater. Short arc lamps, therefore, have recently had an extremely high gas pressure within the arc tube during operation.

In this short arc lamp, a fused silica glass, spherical or oval arc tube is filled with xenon gas, and furthermore, an anode and a cathode are disposed opposite one another. A side tube is connected to the two ends of the arc tube. On the ends of the side tube, upholding parts of the cathode and anode are sealed. To hold the cathode and anode upholding parts securely, the ends of the side tube on the arc tube sides are shrunk by heating so that shrunken areas with a smaller diameter are formed. To directly hold the upholding parts of the cathode and anode together in the shrunken regions of the side tubes it is, however, necessary to draw the side regions very strongly. The upholding parts of the cathode and anode are, therefore, inserted into cylindrical retaining bodies of fused silica glass and the shrunken areas of the side tube are welded to the cylindrical retaining bodies. In this way, the upholding parts of the electrodes of the cathode and anode are held securely.

As was described above, the shrunken regions of the side tube are welded by heat to the cylindrical retaining bodies and formed into a single part. However, if the side tube is heated over the entire area of the cylindrical retaining bodies in the longitudinal direction, and thus, shrunken regions are formed, at the locations of the shrunken regions 12 which lie above and beyond the faces of the cylindrical retaining bodies 30, suspended locations 14 are formed, as shown in FIG. 5.

Between the faces of the cylindrical retaining bodies 30 which are welded to the shrunken regions 12 and which are formed into a single part and the suspended locations 14, therefore, small wedge-shaped gaps 15 are formed.

If, to prevent formation of these suspended locations 14, the side tube 11 is heated only as far as in front of the ends of the cylindrical retaining bodies 30, shrunken regions 12 are formed which are not welded at the ends of the cylindrical retaining bodies 30, as shown in FIG. 6 because the part of the side tube 11 which corresponds to the ends of the cylindrical retaining bodies 30 is not heated. These areas form wedge-shaped gaps 15. This means that, in any case, in the corner areas of the faces of the shrunken regions 12 and the cylindrical retaining bodies 30, small wedge-shaped gaps 15 are formed.

As was described above, small wedge-shaped gaps 15 form in the corner areas of the faces of the shrunken regions 12 and the cylindrical retaining bodies 30, when the shrunken regions 12 and cylindrical retaining bodies 30 are welded and made into a single part. Furthermore, since the gas pressure within the arc tube 10 is extremely high during operation, stress is concentrated in the area these wedge-shaped gaps 15, by which cracks form proceeding from them. By means of repeated application of stress, the cracks grow extensively in the diagonal direction; this can ultimately lead to breakage of the lamp in the corner areas of the faces in which the shrunken regions 12 and the cylindrical retaining bodies 30 are in contact will one another.

SUMMARY OF THE INVENTION

Therefore, a primary object of the present invention is to devise a short arc lamp with a high lamp sustaining voltage in which there is no crack formation in the corner areas of the faces of the shrunken regions of a side tube and of the cylindrical retaining bodies for the upholding parts of the electrodes, even if the gas pressure is high during operation.

According to the invention, in a short arc lamp in which, in an arc tube, there are a cathode and an anode disposed opposite one another, in which upholding parts of the cathode and anode are inserted and held in cylindrical retaining bodies, and in which these cylindrical retaining bodies are supported in shrunken regions of a side tube connected to the arc tube, this object is achieved by intermediate layers of metal or ceramic being located between the cylindrical retaining bodies and the shrunken regions, and by the cylindrical retaining bodies and the shrunken regions not being welded to one another, i.e. they are not formed into a single part.

These and further objects, features and advantages of the present invention will become apparent from the following description when taken in connection with the accompanying drawings which, for purposes of illustration only, show several embodiments in accordance with the present invention.

DETAILED DESCRIPTION OF THE INVENTION

Figure 1:
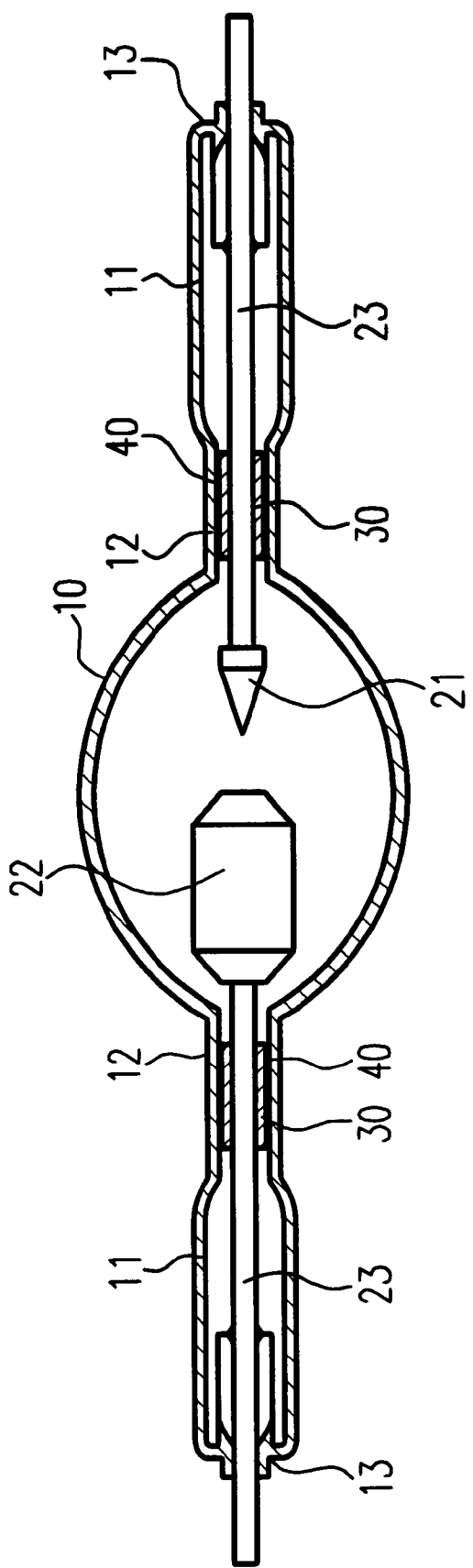
FIG. 1 is a schematic cross-sectional view of a short arc lamp.

FIG. 1 is a schematic representation of a xenon short arc lamp with a nominal power consumption of 10 kW. In a fused silica glass arc tube 10, a cathode 21 and an anode 22 are attached to the tips of a pair of upholding parts 23 that have an outside diameter of 6 mm and are made of tungsten rods. The cathode 21 and anode 22 are disposed opposite one another within that arc to at a distance from one another of 15 mm. The arc tube 10 is filled with 7500 torr of xenon gas. A side tube 11 extends from each of opposite ends of the arc tube 10. In each of the sealed portions 13 on the ends of the side tube 11, a respective upholding-part 23 is sealed.

Figure 2:
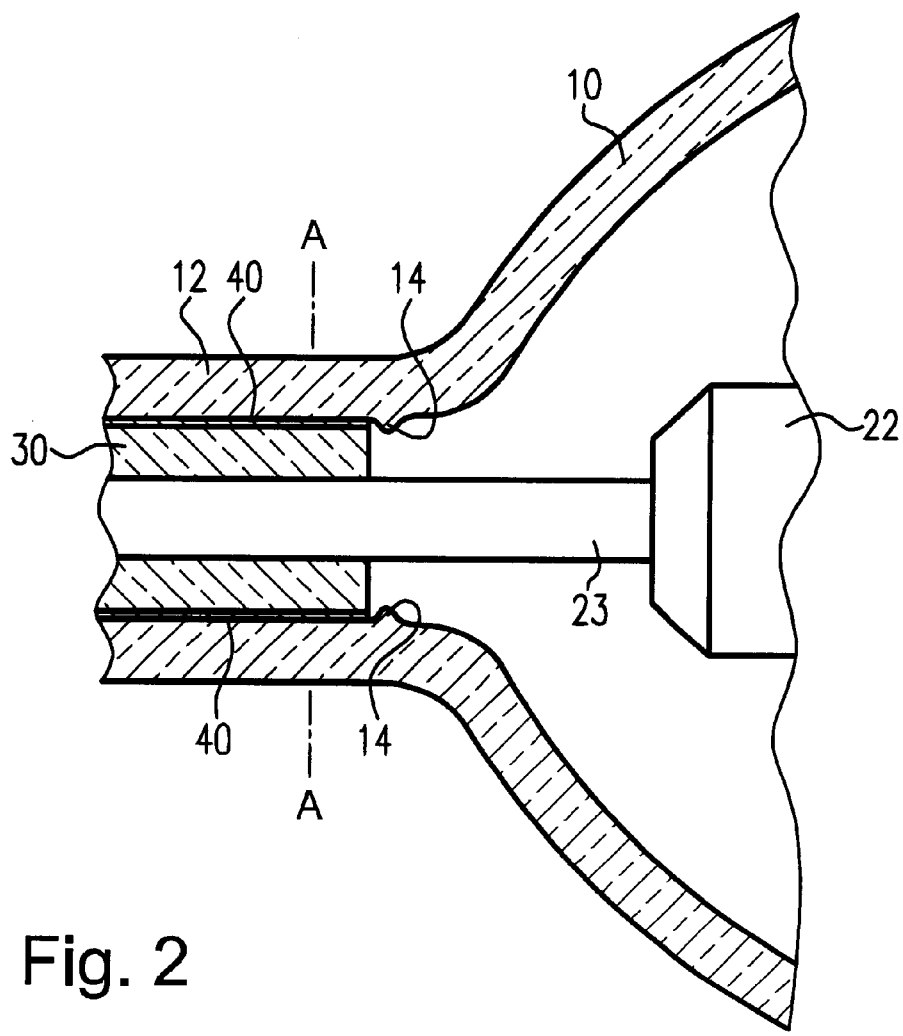
FIG. 2 shows a schematic cross section of important parts of a first embodiment of the invention.

The respective upholding part 23 is inserted into a fused silica glass cylindrical retaining body 30 that has an outside diameter of 12 mm, an inside diameter of 6 mm and a length of 30 mm. This means that the upholding part of the electrode 23 is held by the cylindrical retaining body 30. The arc tube 10 is in a negative pressure state. Heating the ends of the side tube 11 on the sides of the arc tube 10 reduces the diameter of the side tube 11. Thus, shrunken regions 12 are formed. Between the cylindrical retaining bodies 30 and the shrunken regions 12 intermediate layers 40 of metal or ceramic are provided, as shown in FIG. 2. The cylindrical retaining bodies 30 and the shrunken regions 12 are attached without being fused into a single part by welding.

For example, molybdenum films can be used as intermediate layers 40. In the following, production of the shrunken regions is described.

Figure 3:
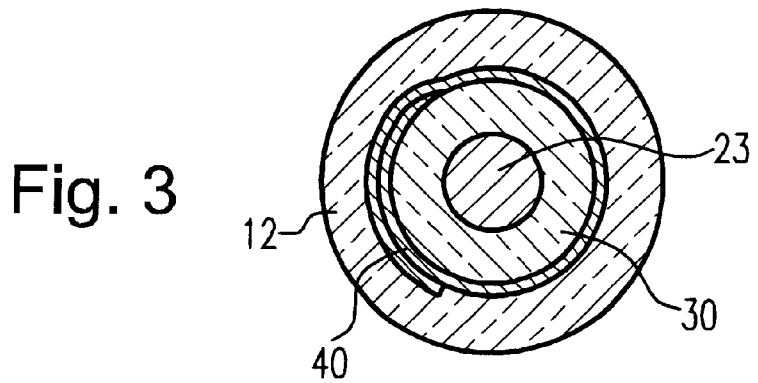
FIG. 3 shows a cross section taken along line A—A in FIG. 2.

First, the outside peripheral surface of the respective cylindrical retaining body 30 is wound with roughly 1.5 turns of a molybdenum film that is 15 microns thick, as is illustrated in FIG. 3. If, in this case, the thickness of the molybdenum film is greater than 20 microns, during winding, a resetting spring force arises; this makes winding difficult. Therefore, it is preferred that the thickness of the molybdenum film be less at most 20 microns.

Then, the inside of the arc tube 10 is subjected to a negative pressure of roughly $1 \times 10^{-3}$ to $1 \times 10^{-4}$ torr and the side tube 11 is heated along the axial direction of the tube. As a result, the diameter of the side tube 11 is reduced and shrunken regions 12 are formed. However, since intermediate layers 40 of molybdenum films are present, the cylindrical retaining bodies 30 and the shrunken regions 12 are attached without their being welded into a single piece.

When a molybdenum film is used for the intermediate layer 40, there are the advantages that handling is simple and production is also extremely simple, because there is only one additional process in which the peripheral surfaces of the cylindrical retaining bodies 30 are wound with molybdenum film. The retaining body 30 need not be a genuine cylinder, but also a polygonal cylinder with at least five corners or a cylinder in which the two ends are tapered and the diameter reduced can be used.

When a conventional short arc lamp is operated, the gas penetrates with high pressure into the gap between the suspended locations 14 and the faces of the cylindrical retaining bodies 30 when suspended locations 14 are formed. However, since the cylindrical retaining bodies 30 and the shrunken regions 12 are not welded together and therefore are not integral, no cracks form in the respective component of the shrunken regions 12 and the cylindrical retaining bodies 30. In the corner regions of the faces of the shrunken regions 12 and cylindrical retaining bodies 30, therefore, destruction of the lamp is prevented.

Figure 4:
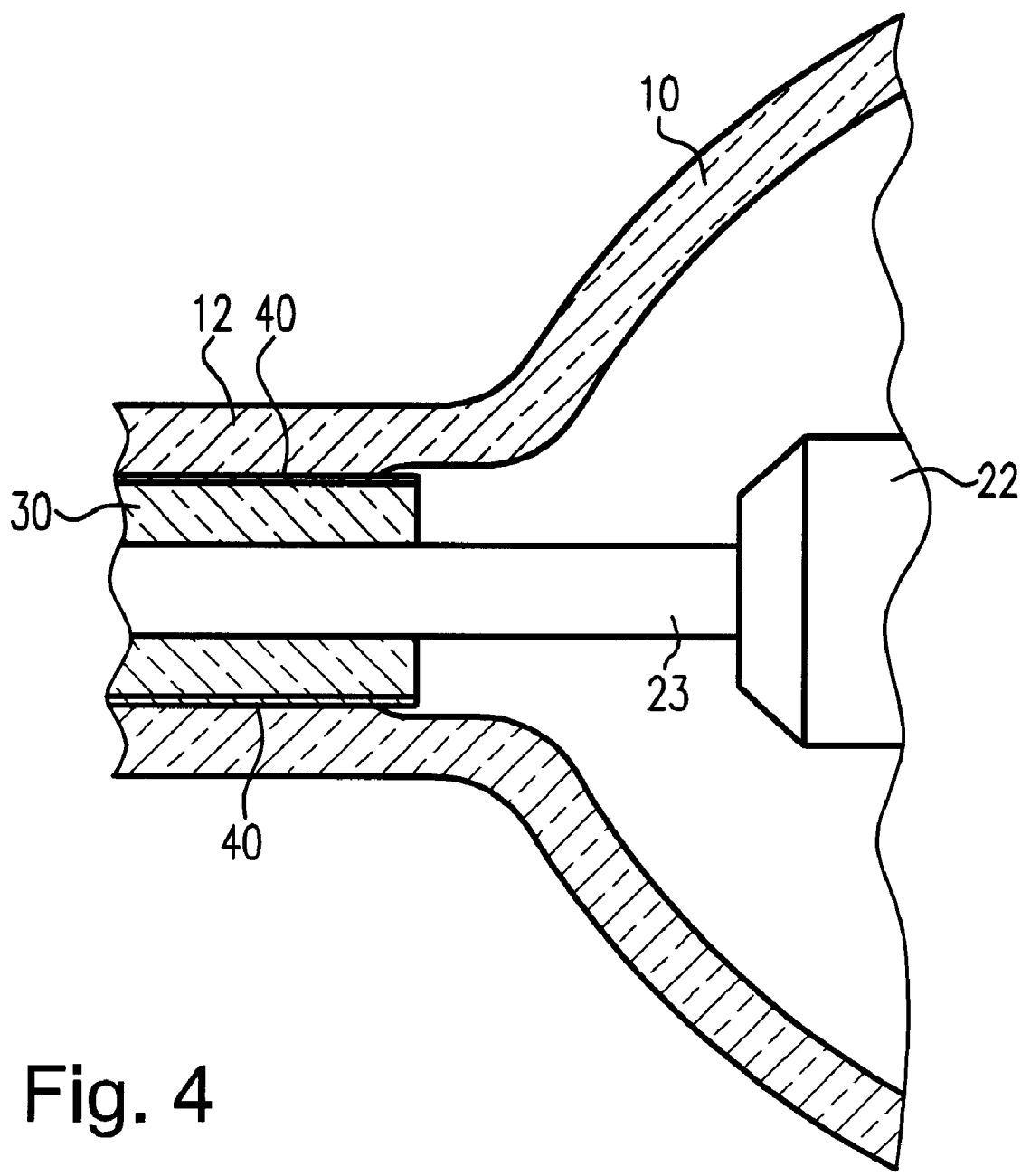
FIG. 4 shows a schematic cross section of important parts in another embodiment of the invention.
Figure 5:
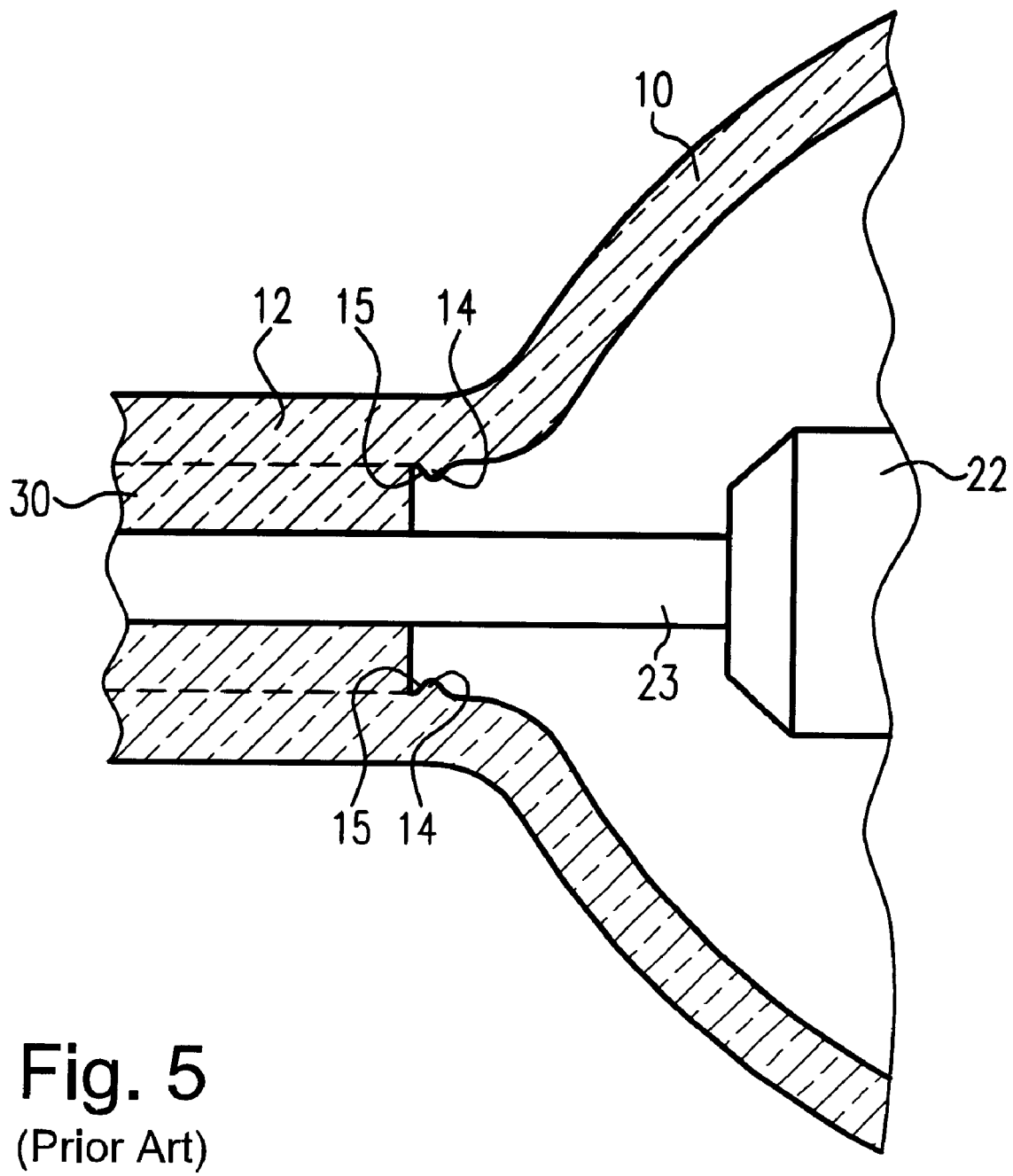
FIG. 5 is a view corresponding to that of FIG. 4 but showing a conventional short arc lamp.
Figure 6:
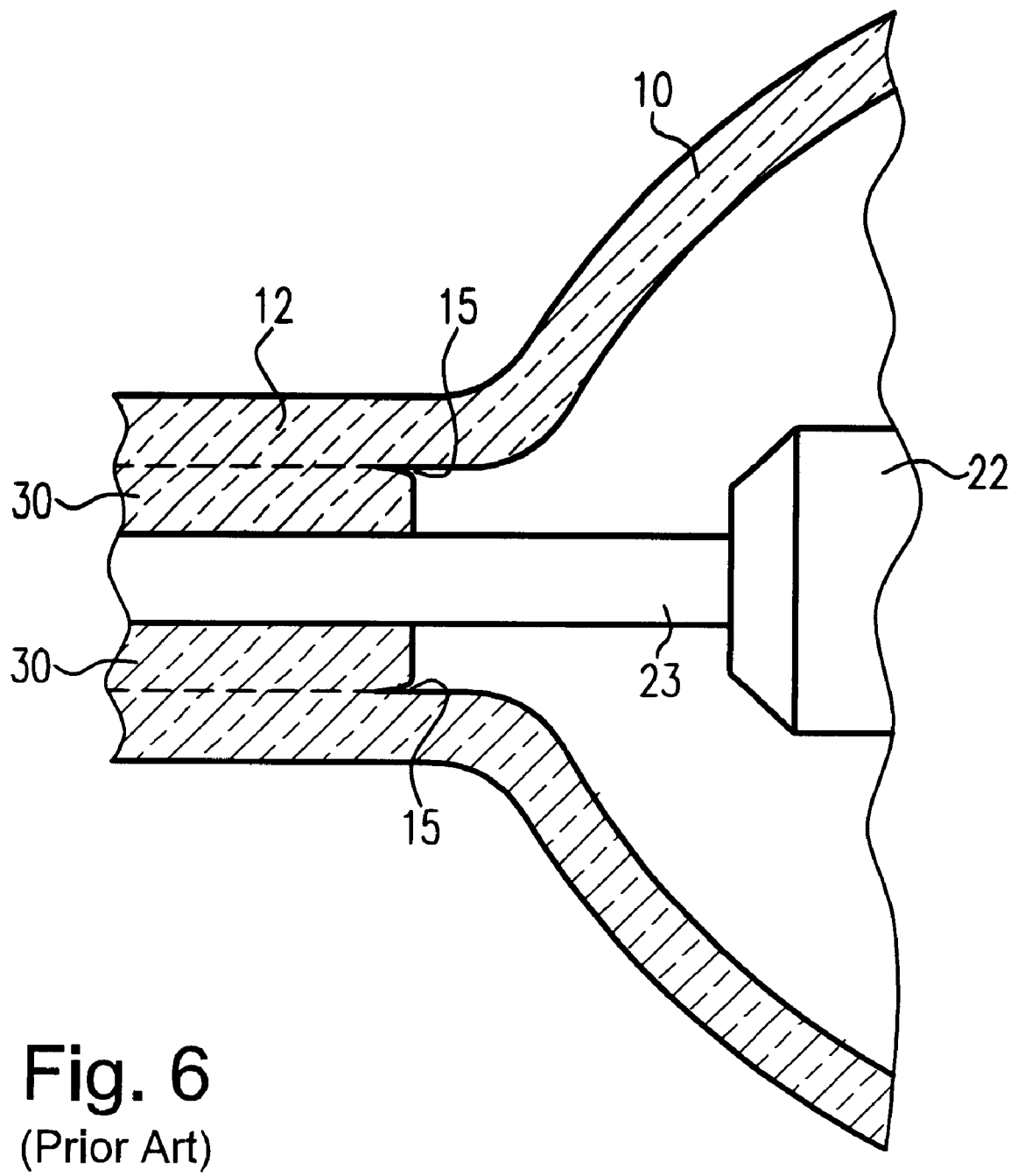
FIG. 6 is a view corresponding to that of FIG. 5 but showing a second conventional short arc lamp.

Even if, to prevent formation of suspended locations 14, the side tube 11 which corresponds to the ends of the cylindrical retaining bodies 30 is not heated and areas are formed which are not welded on, the gas penetrates with high pressure into the areas which are not welded on between the shrunken regions 12 and the cylindrical retaining bodies 30, as is shown in FIG. 4. Since the cylindrical retaining bodies 30 and the shrunken regions 12 are not directly welded together and are therefore not integral, in the respective component of the shrunken regions 12 and the cylindrical retaining bodies 30, no cracks form, even if stress occurs as a result of the lamp voltage. In the corner regions of the faces of the shrunken regions 12 and the cylindrical retaining bodies 30, therefore, destruction of the lamp is prevented.

As a result, the lamp operating sustaining voltage can be increased. Crack formation is also prevented in a bright xenon short arc lamp with increased xenon gas pressure. Thus, lamp breakage can be prevented.

Vacuum evaporated metal layers or sintered ceramic layers can also be used as the intermediate layer 40. Consequently, an example is described in which on the outer peripheral surface of the respective cylindrical retaining body 30 has molybdenum vacuum evaporated thereon by sputtering.

A magnetron sputter device is used with a capture electrode made of metallic molybdenum and with a high frequency-input power current source of 500 W. The cylindrical retaining body 30, as a workpiece, is arranged in argon gas of 10 cc/10 min and 2 Pa roughly 22 cm away from the metallic molybdenum of the capture electrode and is moved with a speed of 1 micron/minute as it is turned. Thus, a 1 micron thick layer of molybdenum is vacuum evaporated onto the outside peripheral surface of the cylindrical retaining body 30.

Next, the inside of the arc tube 10 is subjected to negative pressure and heated, as was described above. In this way, the shrunken region 12 is formed. Also-in this case, the cylindrical retaining body 30 and the shrunken region 12 are attached without being welded together, and therefore, not becoming integral because the intermediate layer 40 of vacuum evaporated molybdenum film is present.

Welding of the cylindrical retaining bodies 30 and shrunken regions 12 to one another can be adequately prevented when the thickness of the vacuum evaporated molybdenum film is at least equal to 1 micron.

When a ceramic layer is used as the intermediate layer 40, powdered ceramic of aluminum oxide, zirconia, silicon carbide, tantalum carbide, titanium oxide or the like can be dissolved in a binder and thus a solution for application can be produced, which is applied in a given thickness on the outside peripheral surface of the respective cylindrical retaining body 30. By heating and sintering, a ceramic layer can be produced.

Then, shrunken regions 12 are formed by the above described process. Since the intermediate layer 40 of ceramic is present, the cylindrical retaining bodies 30 and the shrunken regions 12 are attached, also in this case, without being directly welded to one another and without being integrally formed.

Action of the Invention

As was described above, in the short arc lamp of the invention, between the cylindrical retaining bodies for the upholding parts of the electrodes and the shrunken regions of the side tube, there is at least one intermediate layer of metal or ceramic. Thus, welding of the cylindrical retaining bodies and the shrunken regions to one another can be prevented. This prevents formation a one-piece arrangement of these parts, and therefore, prevents cracks from penetrating into the respective component of the cylindrical retaining bodies and the shrunken regions, even if the gas pressure is high during operation. As a result, the lamp is prevented from being destroyed in the corner regions of the faces of the shrunken regions and the cylindrical retaining bodies, so that the operating sustaining voltage can be increased and a bright short arc lamp obtained.

We claim:

1. Short arc lamp comprising an arc tube having side tubes at opposite sides thereof, a cathode and an anode disposed opposite one another in the arc tube, each of the cathode and the anode being supported on an upholding part that is inserted and held in a cylindrical retaining body which is fixed in a shrunken region of a respective side tube; wherein at least one intermediate layer is located radially between each cylindrical retaining body and the respective shrunken region, and wherein said at least one intermediate layer is a molybdenum foil wound in excess of fall turn about an outer peripheral surface of each cylindrical retaining body.

2. Short arc lamp as claimed in claim 1, wherein said molybdenum foil is a film having a thickness of at most 20 microns.

3. Short arc lamp as claimed in claim 1, wherein said at least one intermediate layer is a ceramic selected from the group consisting of aluminum oxide, zirconia, silicon carbide, tantalum carbide, or titanium oxide.

4. Short arc lamp as claimed in claim 3, wherein said ceramic is a sintered-on ceramic layer.

5. Short arc lamp as claimed in claim 1, wherein said metal is a vacuum evaporated-on layer.

6. Short arc lamp as claimed in claim 5, wherein said vacuum evaporated-on layer is 1 micron thick.

7. Short arc lamp according to claim 1, wherein the shrunken region is an area peripherally surrounding the cylindrical retaining body and has a smaller diameter than other portions of the side tube.

* * * * *